United States Patent
Orlowski et al.

(10) Patent No.: US 7,238,580 B2
(45) Date of Patent: Jul. 3, 2007

(54) SEMICONDUCTOR FABRICATION PROCESS EMPLOYING STRESS INDUCING SOURCE DRAIN STRUCTURES WITH GRADED IMPURITY CONCENTRATION

(75) Inventors: Marius K. Orlowski, Austin, TX (US); Vance H. Adams, Austin, TX (US); Chun-Li Liu, Mesa, AZ (US); Matthew W. Stoker, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 319 days.

(21) Appl. No.: 11/043,577

(22) Filed: Jan. 26, 2005

(65) Prior Publication Data

US 2006/0166492 A1 Jul. 27, 2006

(51) Int. Cl.
*H01L 21/336* (2006.01)
(52) U.S. Cl. .................................... 438/300
(58) Field of Classification Search .......... 438/301, 438/283, 289, 290, 300, 299, 592
See application file for complete search history.

(56) References Cited

U.S. PATENT DOCUMENTS

| | | | |
|---|---|---|---|
| 6,214,679 B1 * | 4/2001 | Murthy et al. | 438/299 |
| 6,621,131 B2 * | 9/2003 | Murthy et al. | 257/408 |
| 6,885,084 B2 * | 4/2005 | Murthy et al. | 257/622 |
| 6,891,192 B2 * | 5/2005 | Chen et al. | 257/49 |
| 7,166,528 B2 * | 1/2007 | Kim et al. | 438/607 |
| 2002/0190284 A1 * | 12/2002 | Murthy et al. | 257/286 |
| 2005/0029601 A1 * | 2/2005 | Chen et al. | 257/369 |
| 2006/0086987 A1 * | 4/2006 | Chen et al. | 257/369 |
| 2006/0115949 A1 * | 6/2006 | Zhang et al. | 438/300 |
| 2006/0234488 A1 * | 10/2006 | Kim et al. | 438/607 |

OTHER PUBLICATIONS

Huang et al., Reduction of Source/Drain Series Resistance and Its Impact on Device Performance for PMOS Transistors with Raised Si1-x Gex Source/Drain, EDL v.21(9), 2000.
Aubry et al., Schottky Barrier Heights of W on Si 1-x Gex Alloys, Appl. Phys. Lett. v.63(18), p. 2520-2522, 1993.
Gannavaram, et al, Low Temperature (</=800° C) Recessed Junction Selective Silicon-Germanium Source/Drain Technology for sub-70 nm CMOS, IEDM p. 437, IEEE 2000.

* cited by examiner

*Primary Examiner*—M. Wilczewski
*Assistant Examiner*—Seth Barnes

(57) ABSTRACT

A semiconductor fabrication process has recessed stress-inducing source/drain (SISD) structures that are formed using a multiple phase formation process. The SISD structures are semiconductor structures having a lattice constant that differs from a lattice constant of the semiconductor substrate in which the source/drain structures are recessed. The SISD structures preferably include semiconductor compound having a first element (e.g., silicon) and a second element (e.g., germanium or carbon). The SISD structure has a composition gradient wherein the percentage of the second element varies from the upper surface of the source/drain structure to a lower surface of the SISD structure. The SISD structure may include a first layer with a first composition of the semiconductor compound underlying a second layer with a second composition of the semiconductor compound. The second layer may include an impurity and have a higher percentage of the second element that the first layer.

16 Claims, 4 Drawing Sheets

US 7,238,580 B2

SEMICONDUCTOR FABRICATION PROCESS EMPLOYING STRESS INDUCING SOURCE DRAIN STRUCTURES WITH GRADED IMPURITY CONCENTRATION

FIELD OF THE INVENTION

The invention is in the field of semiconductor fabrication and, more particularly, semiconductor fabrication processes that use silicon germanium or other types of stress-inducing materials to improve carrier mobility.

RELATED ART

In the field of semiconductor fabrication, stress-inducing materials are used to improve carrier mobility. A stress inducing material refers to a material that, when formed overlying or adjacent another structure or layer, creates either compressive or tensile stress. Under compressive uniaxial stress in the channel direction, silicon exhibits improved hole mobility desirable for PMOS devices while silicon in tensile stress generally causes improved electron mobility desirable for NMOS devices.

Stress-inducing structures (also referred to as strain-inducing structures or stressors) have been formed in source/drain regions of transistors to create enhanced mobility devices sometimes referred to as strained silicon devices. Unfortunately, when a stress-inducing source/drain (SISD) structure is subsequently doped with an impurity to form source/drain regions, the stress characteristics of the transistor may change. Specifically, introduction of even moderate levels of source/drain impurities into a stress-inducing source/drain structure may relax the stress associated with the structure. Stress relaxation undesirably reduces the carrier mobility benefits of SISD structures. Accordingly, it would be desirable to implement a process and transistor that permitted the introduction of a source/drain impurity into a SISD without sacrificing the stress characteristics of the SISD. It would be further desirable if the implemented process were suitable for both NMOS and PMOS devices. It would be still further desirable if the implemented process were easily integrated into conventional processing technologies.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention encompasses a semiconductor fabrication process in which stress-inducing source/drain (SISD) structures are formed using a multiple phase formation process. The SISD structures are semiconductor structures having a lattice constant that differs from a lattice constant of the semiconductor substrate in which the source/drain structures are recessed. The SISD structures preferably include semiconductor compound having a first element (e.g., silicon) and a second element (e.g., germanium, carbon, et al.). The percentage of the second element varies from the upper surface of the source/drain structure to a lower surface of the SISD structure.

In one embodiment, the SISD structure includes a first layer having the lowest percentage of the second element and a second layer overlying the first layer. The percentage of the second element in the second layer is greater than the percentage in the first layer. In addition, the second layer may further include a p-type or n-type impurity that may be introduced in situ during formation of the SISD structure. The increased percentage of the second element in the second layer counters stress relaxation resulting from the impurity. The SISD structure may further include a third layer overlying the second layer where the percentage of the second element in the third layer exceeds the percentage of the second element in the second layer. In this embodiment, the relatively high percentage of the second element in the third layer reduces the resistance of subsequently formed contact structures.

Figure 1:
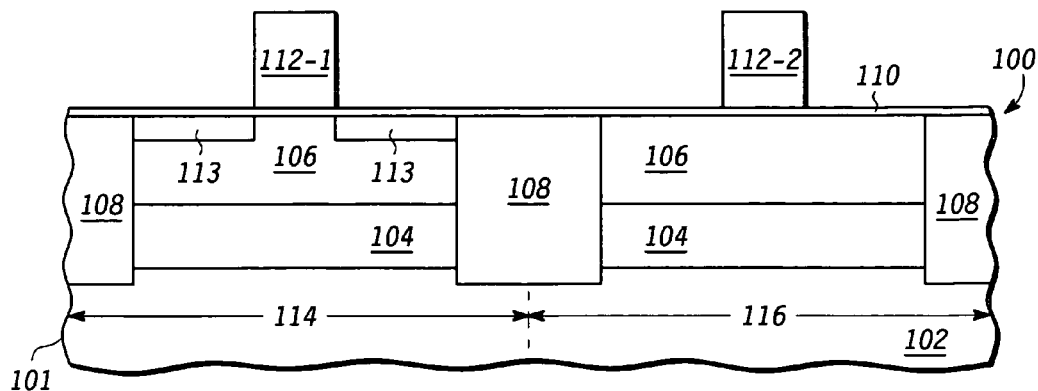
FIG. 1 is a partial cross-sectional view of a wafer at an intermediate stage in a semiconductor fabrication process according to an embodiment of the present invention.

Referring now to the drawings, FIG. 1 through FIG. 9 depict a first embodiment of a semiconductor fabrication method for producing integrated circuits having SISD structures characterized by a composition gradient. In FIG. 1, an integrated circuit 100 is show at an intermediate stage in the fabrication process. As depicted in FIG. 1, integrated circuit 100 includes first and second gate electrodes 112-1 and 112-2 respectively (collectively or generically referred to herein as gate electrode(s) 112). Gate electrodes 112 overlie a gate dielectric 110. Although the depicted embodiment of integrated circuit 100 uses a single gate dielectric, other embodiments (not depicted) may use a first gate dielectric underlying first gate electrode 112-1 and a second gate dielectric underlying second gate electrode 112-2.

Gate dielectric 110 is formed on an upper surface of a semiconductor wafer 101. The depicted embodiment of wafer 101 is a silicon-on-insulator (SOI) wafer in which a semiconductor layer 106 overlies a buried oxide (BOX) layer 104. BOX layer 104 overlies a substrate bulk 102. In one embodiment, substrate bulk 102 comprises single crystal silicon, BOX layer 104 is a silicon dioxide layer, and semiconductor layer 106 is another crystalline silicon layer. Isolation trenches 108 of wafer 101 provide physical and electrical isolation between adjacent regions of semiconductor layer 106. In other embodiments (not depicted), wafer 101 is a "bulk" wafer that does not include a BOX layer 104.

In the depicted embodiment, two gate electrodes 112 are shown where first gate electrode 112-1 overlies a first region (referred to herein as the first well region) 114 of substrate 102 and a second gate electrode 112-2 overlies a second well region 116. In one embodiment, semiconductor layer 106 in first well region 114 is n-doped (thereby making it suitable for forming PMOS transistors) while semiconductor layer 106 in second well region 116 is p-doped (thereby making it suitable for forming NMOS transistors). In this embodiment, first well region 114 may be referred to as PMOS region 114 and second well region 116 may be referred to as NMOS region.

FIG. 1 further illustrates an extension implant 113, self-aligned to the position of gate electrode 112-1, in an upper portion of semiconductor layer 106 in first well region 114. Extension implants are widely used in the field of semiconductor fabrication to reduce the electrical field proximal to the gate dielectric 110. Extensions implants 113 are typically p-type dopants (e.g., boron) for PMOS transistor regions and n-type dopants (e.g., phosphorous or arsenic) for NMOS transistor regions. Although FIG. 1 depicts an extension implant 113 in conjunction with the transistor being formed over first well region 114 and no extension implant in conjunction with the transistor being formed over second well region 116, other embodiments may use extension implants for both PMOS and NMOS transistors or no extension implants at all.

Figure 2:
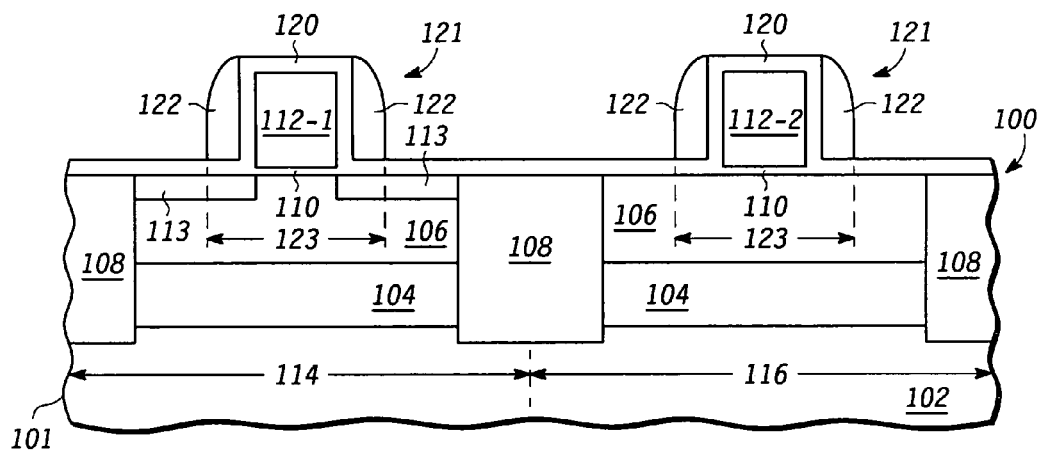
FIG. 2 depicts processing subsequent to FIG. 1 in which a liner dielectric and spacer structures are formed on a gate electrode.

Referring now to FIG. 2, a liner 120 is formed overlying wafer 101 (i.e., overlying the topography defined by gate electrodes 112 on an upper surface of gate dielectric 110). Liner 120 is preferably a deposited silicon oxide. Dielectric spacers 122 are formed adjacent liner 120 on sidewalls of gate electrodes 112. Spacers 122 are preferably silicon nitride spacers formed by depositing a conformal silicon nitride film over liner 120 and thereafter performing an anisotropic etch of the film in a manner that is well known. The structure that includes gate electrodes 112, liner 120, and spacers 122 is referred to herein as gate structure 121. Gate structures 121 define boundaries of an underlying gate structure region 123. Gate structure region 123 includes the transistor's channel region (underlying gate electrode 112) and portions of the substrate underlying spacers 122.

The preferred embodiment of the fabrication process forms SISD structures in selected areas of the wafer. In one implementation, SISD structures are formed selectively in all or some of the PMOS transistors. In another implementation, SISD structures are formed selectively in all or some of the NMOS transistors. In still another implementation, a first type of SISD structure is formed in all or some of the PMOS transistors and a second type of SISD structures is formed in all or some of the NMOS transistors. The processing sequence depicted in the drawings illustrates the formation of SISD structures in one type of transistor (either NMOS or PMOS), but not the other. Extending the depicted processing sequence to encompass the case of two types of SISD structures would be obvious to one skilled in the art having the benefit of this disclosure.

Figure 3:
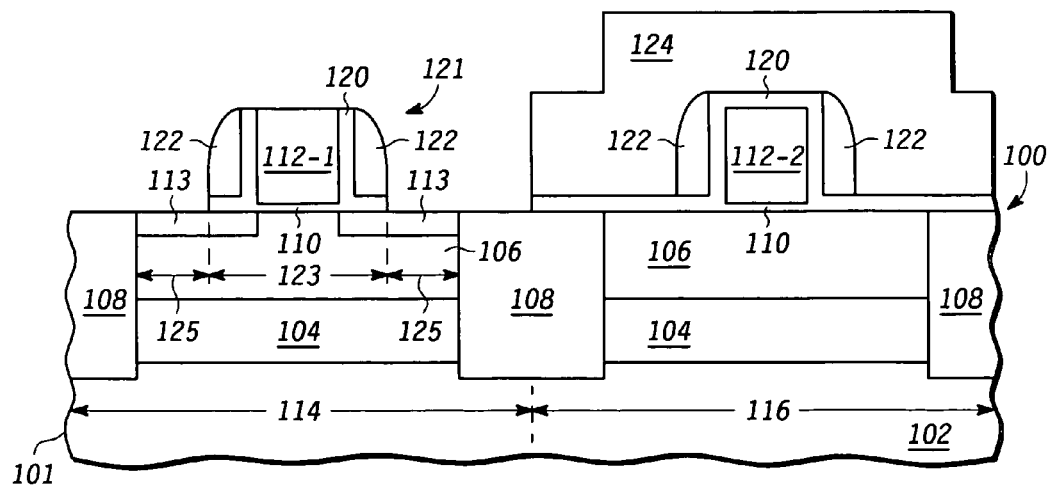
FIG. 3 depicts processing subsequent to FIG. 2 in which a second well region of the wafer is masked and exposed portions of the liner dielectric overlying a first well region are removed.

Referring now to FIG. 3, a mask 124 is patterned over selected areas of wafer 101. In the depicted embodiment, mask 124 is patterned to mask the portion of wafer 101 corresponding to second well region 116 while exposing the portion of wafer 101 corresponding to first well region 114. Mask 124 is preferably a photoresist mask formed with conventional photolithographic processing. In other implementations, mask 124 may be a hard mask (e.g., oxide or silicon nitride). Following the formation of patterned mask 124, exposed portions of liner 120 are dipped off (e.g., in dilute HF) or otherwise removed to expose the source/drain regions 125 of semiconductor layer 106 in the first well region 114 of wafer 101. For purposes of this disclosure, source/drain drain regions 125 represent the portions of semiconductor layer 106 that are exterior to the gate structure region 123 although skilled practitioners will recognize some overlap of source/drain regions 125 and gate structure regions 123 in actual devices.

Figure 4:
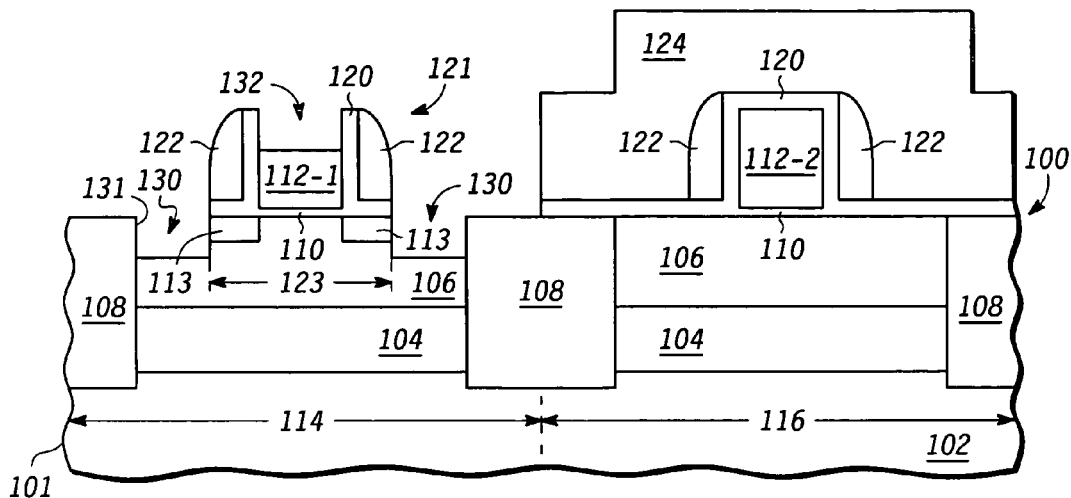
FIG. 4 depicts processing subsequent to FIG. 3 in which source/drain voids are formed in the substrate of the first well region on either side of a gate structure region defined by position of the gate electrode.

Referring now to FIG. 4, source/drain recesses 130 are formed in the source/drain regions 125 (see FIG. 3) of semiconductor layer 106 in first well regions 114 of wafer 101. In the depicted embodiment, source/drain recesses 130 are formed with an anisotropic (dry) etch process. In this embodiment, source/drain recesses 130 have sidewalls 131 that are substantially vertical and substantially aligned to the gate structure region 123 defined by channel structure 121. In an embodiment where semiconductor layer 106 and gate electrode 112-1 are both comprised of the same or similar material (e.g., silicon and polysilicon), the formation of source/drain recesses 130 also creates a gate electrode void 132 as the etch process consumes the silicon or polysilicon material in gate electrode 112-1.

The specific dry etch process used to form source/drain recesses 130 may have multiple steps or phases. In an exemplary process, the etch sequence to form source/drain voids 130 may include an HCl vapor etch, a dip in a $HNO_3$-HF solution (e.g., $HNO_3$:HF ratio of 750:1), a fluorine-based etch (e.g., a remote plasma etch using $NF_3$), or an etch step using $Cl_2$, HBr, and $H_2O_2$. In the depicted embodiment, where wafer 101 is an SOI wafer, source/drain voids 130 extend partially into, but not entirely through, semiconductor layer 106. Leaving some of the semiconductor layer 106 under source/drain recesses 130 facilitates (provides a seed for) a subsequent epitaxial process for forming SISD structures.

Figure 5:
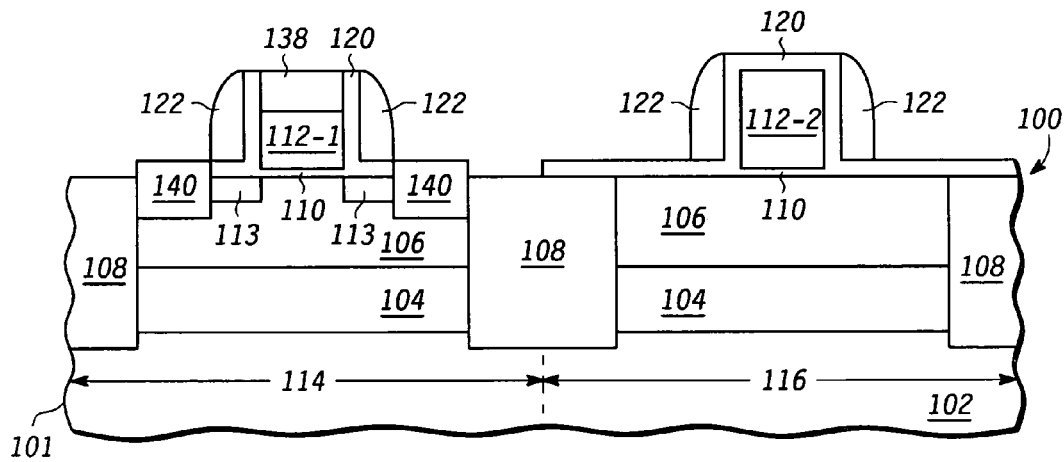
FIG. 5 depicts processing subsequent to FIG. 4 in which the second well region mask is removed and the source/drain voids are filled with source/drain structures.

Referring now to FIG. 5, SISD structures 140 are formed to fill the source/drain recesses 130 (shown in FIG. 4) while, simultaneously, a gate electrode material 138 fills the gate electrode voids 132 (shown in FIG. 4). The depicted embodiment of SISD structures 140 may also be referred to herein as recessed SISD structures 140 because, in contrast to conventional elevated SISD structures used in some SOI fabrication processes, the majority of a recessed SISD structure is displaced or positioned below the wafer upper surface. However, portions of the refilled source/drain recesses may extend above the original surface of the source/drain regions thus forming elevated portions of source/drain regions.

In the preferred embodiment, SISD structures 140 are formed by epitaxial growth using semiconductor layer 106 as a seed. As suggested by their name, SISD structures 140 are preferably stress-inducing structures. Stress-inducing structures include structures having a lattice constant that differs from the lattice constant of the surrounding material (i.e., different than the lattice constant of semiconductor layer 106). For embodiments in which semiconductor layer 106 is silicon, stress-inducing structures include, for example, silicon germanium structures and silicon carbon structures.

Thus, SISD structures 140 may include a silicon compound (sometimes referred to herein as SiX), such as SiGe or SiC where the compound has a lattice constant that is different than the lattice constant of silicon. In addition, the preferred embodiment of SISD structures 140 have a composition gradient wherein the percentage (by weight) of "X" in proximity to an upper portion of SISD structures 140 is greater than the percentage of "X" in proximity to a lower portion of SISD structures 140. The lower portion of SISD structures 140 refers to the portion of SISD structures 140 in proximity to the interface between SISD structures 140 and the underlying semiconductor material 106 whereas the upper portion of SISD structures 140 refers to the exposed portion of SISD structure 140 near an upper surface of wafer 101.

The composition gradient in the SiX compound enables the introduction of a doping impurity such as boron (for PMOS) or phosphorous or arsenic (for NMOS) into the upper portion of SISD structures 140 without a significant degradation or relaxation of the stress-inducing characteristics of SISD structures 140. In the absence of the composition gradient, the introduction of a source/drain impurity into SISD structures 140 would tend to relax the stress-inducing characteristics of the structure thereby detrimentally reducing the carrier mobility benefits achieved by the induced uni-axial stress.

Figure 6:
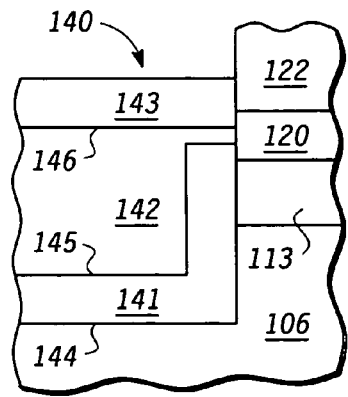
FIG. 6 depicts additional detail of the source/drain structures of FIG. 5 according to one embodiment of the invention.
Figure 7:
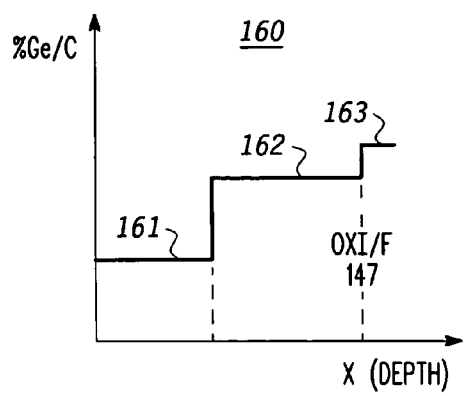
FIG. 7 graphically depicts a graded composition of the source/drain structures of FIG. 6.

Referring now to FIG. 6, one implementation of SISD structures 140 are illustrated in greater detail. In the depicted embodiment, SISD structures 140 include a third layer 143 overlying a second layer 142 overlying a first layer 141. In one embodiment, each of the layers 141 through 143 is comprised of SiX where SiX is a semiconductor and X is a semi-metallic such as germanium, a non-metallic such as carbon, or another element. The percentage of X in second layer 142 is greater than the percentage of X in the first layer 141 (i.e., the Si:X ratio of SiX in second layer 142 is less than the Si:X ratio in first layer 141). Similarly, the percentage of X in third layer 143 is greater than the percentage of X in second layer 143. In one embodiment, second layer 142 and/or third layer 143 of SISD structure 140 may also include a source/drain impurity such as boron, arsenic, or phosphorous.

In the depicted embodiment, first layer 141 extends from an interface 144 with the underlying semiconductor layer 106 to the interface 145 with second layer 142, which is located below the interface 147 between semiconductor layer 106 and liner oxide 120. The second layer 142 extends from interface 145 to the interface 146 with third layer 143.

In the preferred embodiment, SISD structures 140 such as the structure depicted in FIG. 6 are formed with a three-phase epitaxial process. This embodiment is depicted graphically in FIG. 7. In this embodiment, wafer 101 is placed in an epitaxial chamber maintained at an appropriate temperature and pressure. During the first phase (during which first layer 141 is grown), the percentage of X in the ambient is maintained at a first level that results in the first layer 141 of SISD structure 140 having a first percentage of X (whether X is germanium, carbon, or another element). The first percentage of X is identified by reference numeral 161 in FIG. 7. When the first phase is completed and first layer 141 is formed, the percentage of X in the ambient is increased so that the percentage of X in the second layer is maintained at a second level 162. During a third phase, the percentage of X is increased again so that the percentage of X (163) in third layer 143 is higher still. In this manner, the concentration of X, when graphed as a function of wafer depth, resembles a multi-stage step function.

The percentage of X used in each layer of SISD structures 140 is implementation specific and depends on the element used. For PMOS implementations, in which the silicon compound is SiGe, the first percentage 161 (i.e., the percentage of Ge in first layer 141) is preferably less than approximately 20% while the second percentage 162 is preferably greater than approximately 25% and the third layer 163 is greater than the second percentage 162. For an NMOS in which SiX is SiC, the first percentage 161 is preferably less than approximately 1%, the second percentage 162 is preferably greater than approximately 1.5%, and the third percentage 163 is preferably greater than the second percentage 162 and less than 2%, which is a practical maximum for carbon in SiC.

Some embodiments use in-situ-doped SISD structures 140. In such embodiments, an impurity such as boron, phosphorous, or arsenic, is introduced into SISD structures 140 as the structures are being grown epitaxially or otherwise. In one implementation, the increase in the concentration of X coincides with the introduction of the in situ dopant. In a PMOS application, for example, boron may be introduced into the epitaxial chamber when the percentage of germanium is increased from first percentage 161 to second percentage 162.

In this embodiment, increasing the percentage of germanium when the boron is introduced maintains the overall stress-inducing characteristics of SISD structure 140. In addition, the higher concentration of germanium in second layer 142 is believed to provide higher electrical activation of the boron impurities thereby resulting in desirably lower source/drain sheet resistance. In embodiments that employ the third layer 143, the higher concentration of germanium in third layer 143 is believed to lower the Schottky barrier between the SISD structure 140 and a subsequently deposited or formed metal thereby resulting in lower contact resistance. Exemplary metals suitable for forming such a contact include nickel silicide and cobalt silicide.

In embodiments that do not use in-situ-doped SISD structures 140, the source/drain impurity may be introduced into SISD structures 140 using conventional ion implantation after completing the formation of SISD structures 140. The in-situ-doped embodiment enjoys the benefit of precisely coinciding the introduction of boron (in the PMOS case) with the increase in germanium.

As depicted in FIG. 6, first layer 141 forms conformally within the source/drain recesses 130 of FIG. 4 (i.e., along the sidewalls of recesses 130 as well as the floor). In this embodiment, Because first layer 141 effectively terminates the extension implant 113. Because first layer 141 may be non-conductive or only slightly conductive, first layer 141 may undesirably serve as an electrically insulating film between extension implant 113 and SISD 140. As a result, it may be desirable to perform an additional extension implant following formation of SISD's 140 to electrically connect extension implant 113 to the more conductive layers of SISD 140 (i.e., second layer 142 and third layer 143).

Figure 8:
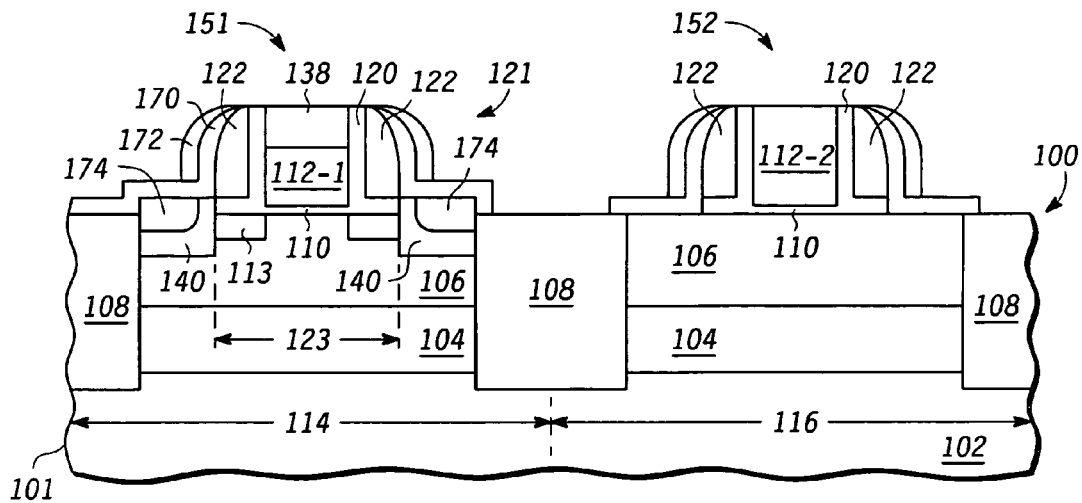
FIG. 8 depicts processing subsequent to FIG. 5 in which a second liner and second spacers are formed on the gate structure and source/drain impurity regions are introduced into the source/drain structures.

Turning now to FIG. 8, additional processing is performed on integrated circuit 100 following the formation of SISD structures 140. In the depicted embodiment, a second liner oxide 170 and second silicon nitride spacer structures 172 are formed adjacent the first spacers 122. A source/drain implant may then be performed after forming a mask (not depicted) over second well regions 116 of wafer 101 to introduce a source/drain impurity distribution 174 into the SISD structures 140. This implant step may be omitted when a source/drain impurity is introduced in situ during formation of SISD structures 140.

FIG. 8 depicts the integrated circuit 100 including a first transistor 151 and a second transistor 152. First transistor 151 includes the gate structure 121 overlying gate structure region 123 in a first well region 114 semiconductor layer 104. Extension implants 113 are located underlying the gate structure 121 and aligned to gate electrode 112-1. SISD structures 140 are recessed within semiconductor layer 106 on either side of gate structure region 123. The SISD structure material is preferably a silicon compound having a lattice constant that differs from the lattice constant of silicon. Source/drain structure 140 preferably also includes a graded composition in which the percentage of silicon near the bottom of SISD structure 140 is greater than the silicon percentage near the top.

SISD structures 140 may include a stepped composition gradient in which the composition is relatively uniform throughout a first layer or portion of the SISD structure, but then changes abruptly to a second composition within a second layer of the SISD structure and possibly a third composition in a third layer.

In an embodiment where first well region 114 is an n-doped well and first transistor 150 is a PMOS transistor, SISD structures 140 may include silicon germanium with a graded concentration of germanium. For NMOS transistor embodiments, SISD structures 140 may include silicon carbon. Although FIG. 8 shows an embodiment of second transistor 152 that does not have a SISD structure analogous to SISD structures 140, other embodiments of the invention may fabricate SISD structures for both PMOS and NMOS transistors. In this embodiment, the processing steps to form the second type of recess, SISD structures would closely parallel the processing steps required to form SISD structures 140.

Figure 9:
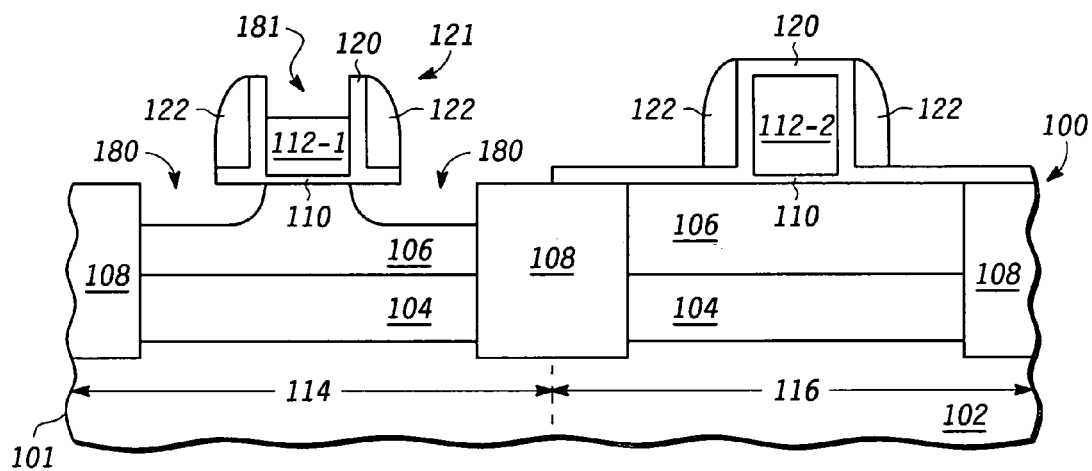
FIG. 9 depicts processing subsequent to FIG. 3 according to an alternative embodiment wherein the source/drain voids are formed with an isotropic etch and the second well region mask is removed.

Turning now to FIG. 9 through FIG. 13, an alternative embodiment of the present invention, emphasizing the formation of SISD structures using a wet etch approach, is illustrated. FIG. 9 depicts processing that occurs subsequent to the processing depicted in FIG. 3 (and in lieu of the processing depicted in FIG. 4 through FIG. 8). In FIG. 9, source/drain voids 180, which are analogous to source/drain voids 140 described above, have been formed in an upper portion of semiconductor layer 106 in the first well region 114 of wafer 101. A gate electrode void 181 was simultaneously formed in gate electrode 112-1. The mask 124 of FIG. 3 has also been removed (preferably after the formation of source/drain voids 180).

Unlike source/drain voids 140 formed with an anisotropic dry etch process, the isotropic etch used to form source/drain recesses 180 produce source/drain recesses 180 that undercut gate structure 121. The isotropic etch to produce source/drain recesses 180 may be a silicon wet etch process in which wafer 101 is dipped in, for example, a buffered solution of nitric acid ($HNO_3$) and HF. A mixture of isotropic and anisotropic etch steps might be employed to achieve an optimized profile of the recess.

Figure 10:
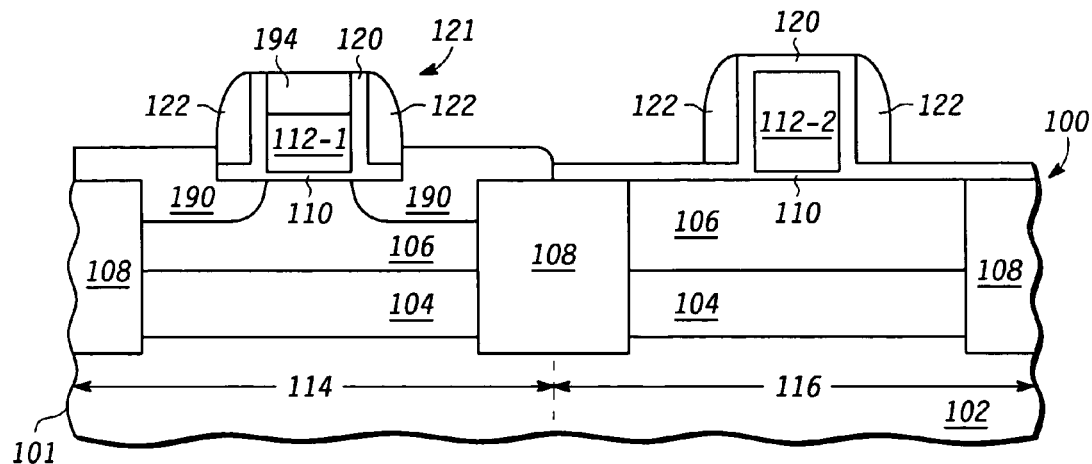
FIG. 10 depicts processing subsequent to FIG. 9 in which the source/drain voids are filled by growing source/drain structures.
Figure 11:
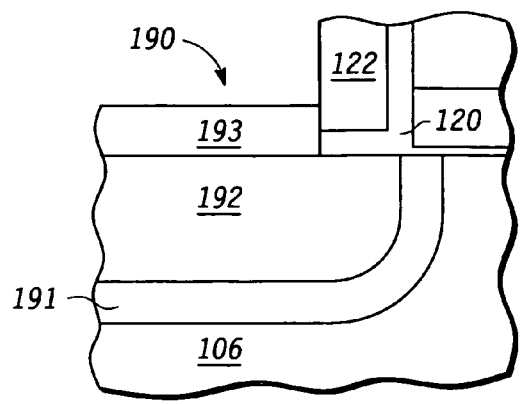
FIG. 11 depicts additional detail of the source/drain structures of FIG. 10.

In FIG. 10, the source/drain recesses 180 of FIG. 9 are filled with SISD structures 190. Analogous to SISD structures 140, SISD structures 190 preferably create compressive or tensile stress (depending upon the application) within the portion of semiconductor layer 106 underlying gate structure 121. In the preferred embodiment, SISD structures 190, like SISD structures 140, are formed of a silicon compound (SiX) using an epitaxial process. In addition, the preferred SISD structures 190 also include a graded composition in which the percentage of increases from the bottom of SISD structures 190 to the top. As depicted in FIG. 11, one embodiment of SISD structures 190 includes a third layer 193 overlying a second layer 192 overlying a first layer 191 analogous to the three layer structure of the preferred embodiment of SISD structures 140. In this embodiment, the silicon percentage of SISD structure 190 is greater in first layer 191 than in second layer 192 and the silicon percentage in second layer 192 is greater than the silicon layer in third layer 193.

Figure 12:
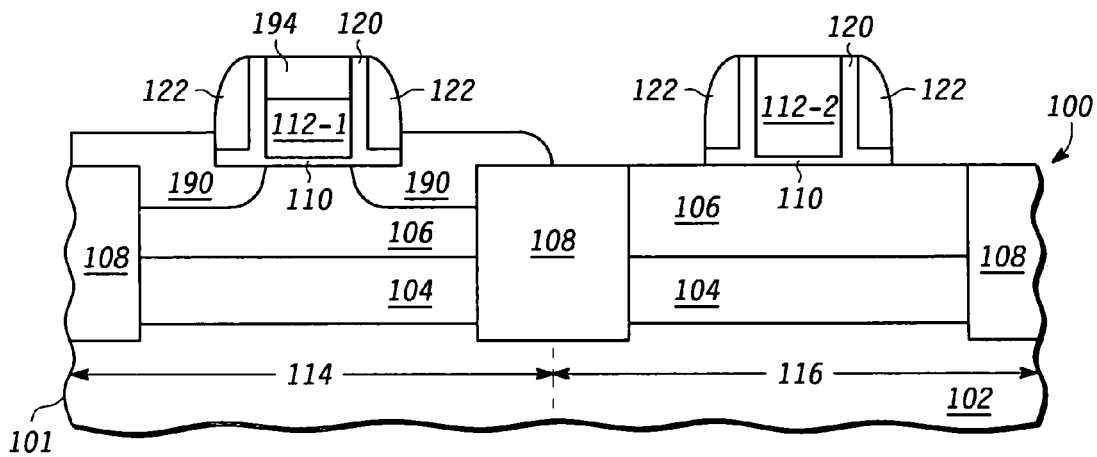
FIG. 12 depicts processing subsequent to FIG. 10 in which exposed portions of the liner oxide is removed.

In FIG. 12, exposed portions of liner oxide 120 overlying portions of second well region 116 are dipped off (in dilute HF, for example) or otherwise removed to expose portions of semiconductor layer 106 in second well region 116.

Figure 13:
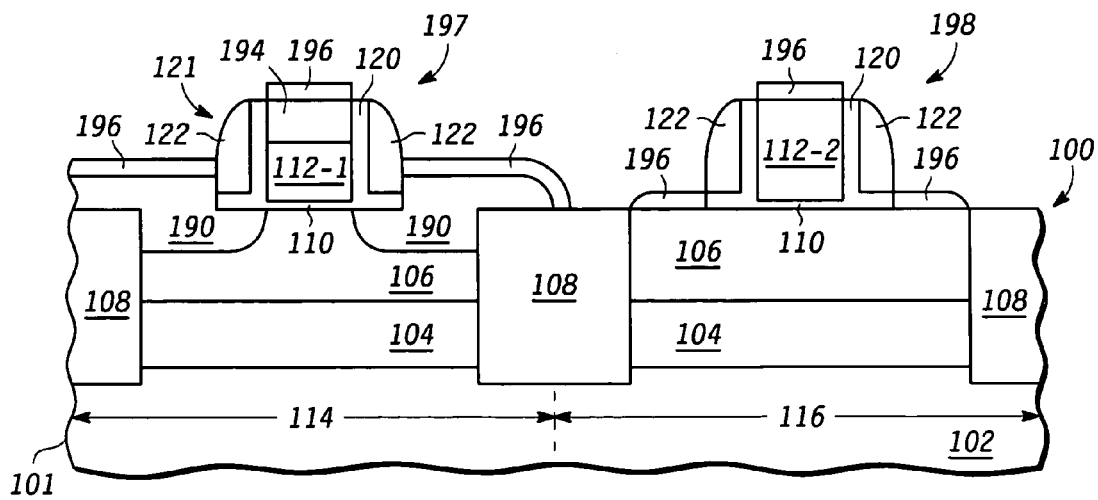
FIG. 13 depicts processing subsequent to FIG. 12 in which a silicide is formed on exposed portions of the source/drain structures and exposed portions of the gate electrode.

In FIG. 13, a silicide, represented by reference numeral 196, is formed overlying any exposed silicon surfaces using conventional silicide techniques. Thus, silicide 196 is formed overlying exposed portions of SISD structures 190, gate electrode 194, gate electrode 112-2, and exposed portions of semiconductor layer 106 in second well region 106.

Analogous to FIG. 8, FIG. 13 depicts an integrated circuit 100 including a first transistor 197 and a second transistor 198. First transistor 197 includes a gate structure 121 overlying a semiconductor layer 104 in a first well region 114 of wafer 101. Recessed SISD structures 190 are located in semiconductor layer 106 displaced on either side of gate structures 121. The SISD structures undercut the gate structure 121. Source/drain structures 191 preferably induce either compressive or tensile stress in the portion of semiconductor layer 106 underlying gate structure 121. In addition, SISD structures 190 preferably include a graded composition in which the percentage of silicon in SISD structures 190 decrease from the bottom of SISD structures 190 to the top. Like the formation of SISD structures 140, SISD structures 190 may be formed with an epitaxial process and the source/drain impurity may be introduced into the structure during a second phase of the epitaxial process. Similarly, SISD structures 190 may include a second layer in which the silicon concentration is reduced and the concentration of a proper source/drain impurity such as boron, phosphorous, or arsenic is incorporated either in situ or by ion implantation.

The preferred embodiments of the processes described above thus include an in situ doped and stress-inducing source/drain region. The impurity is needed for the SISD structure. Decreasing the silicon ratio when the impurity is introduced is believed to maintain stress characteristics of the material that would otherwise be undesirably relaxed by the impurity. Decreasing the silicon ratio during the third phase is believed to facilitate the fabrication of contacts having low contact resistance.

In the foregoing specification, the invention has been described with reference to specific embodiments. However, one of ordinary skill in the art appreciates that various modifications and changes can be made without departing from the scope of the present invention as set forth in the claims below. For example, instead of the SOI wafers depicted, conventional bulk wafers may be used as the starting material. In addition, although the described process illustrates single gate transistors, the process encompasses other type of transistors including, as an example, floating gate transistors suitable for creating nonvolatile storage elements. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
    forming a gate structure including a gate electrode overlying a gate dielectric overlying a semiconductor substrate, wherein boundaries of the gate structure define a gate structure region of the substrate;
    removing portions of source/drain regions in the substrate on either side of the gate structure region to form source/drain voids; and
    filling the source/drain voids with stress-inducing source/drain (SISD) structures, wherein the SISD structures include a second layer overlying a first layer wherein the first and second layers include a silicon compound and wherein a silicon ratio of the silicon compound in the second layer is lower than a silicon ratio of the silicon compound in the first layer.

2. The method of claim 1, wherein the silicon compound in the first and second layers is silicon germanium.

3. The method of claim 2, wherein removing portions of the substrate comprises removing portions of the substrate selectively in PMOS regions of the substrate.

4. The method of claim 2, wherein filling the source/drain voids comprises growing SISD structures with an epitaxial process having a first phase and a second phase, wherein a silicon ratio of an ambient during the second phase is less than a silicon ratio of an ambient during the first phase.

5. The method of claim 4, wherein the ambient during the second phase further comprises a doping impurity.

6. The method of claim 5, wherein the doping impurity comprises boron wherein said second layer comprises in situ boron-doped silicon germanium.

7. The method of claim 6, wherein the SISD structures further include a third layer overlying the second layer wherein the third layer includes a silicon compound and wherein a silicon ratio of the silicon compound in the third layer is less than the silicon ratio in the second layer, and wherein the epitaxial process further includes a third phase wherein a silicon ratio of an ambient during the third phase is less than a silicon ratio of the ambient during the second phase.

8. The method of claim 1, wherein said removing of said portions of the substrate comprises anisotropically etching portions of the substrate external to the gate structure region, wherein the source/drain voids exhibit substantially vertical sidewalls substantially aligned to the gate structure.

9. The method of claim 1, wherein said removing of said portions of the substrate comprises isotropically etching portions of the substrate external to the gate structure region, wherein the SISD structures undercut the gate structure.

10. A semiconductor fabrication process, comprising:
    forming first and second gate electrodes overlying a gate dielectric, wherein the first gate electrode overlies a gate structure region in a first well region of the substrate and wherein the second gate electrode overlies a gate structure region in a second well region of the substrate;
    removing portions of the substrate selectively in the first well region to form source/drain voids displaced on either side of the gate structure region in the first well region; and
    filling the source/drain voids with a semiconductor stress-inducing source/drain (SISD) structure wherein the semiconductor SISD structure includes a wherein a silicon ratio of the structure at an upper surface of the SISD structure is greater than a silicon ratio of a lower surface of the structure.

11. The method of claim 10, wherein filling the source/drain voids comprises forming SISD structures having a second layer overlying a first layer, wherein the first and second layers comprise SiX, where X is an element, and wherein the Si:X ratio in the second layer is less than the Si:X ratio in the first layer.

12. The method of claim 11, wherein the first well region is a PMOS region and wherein X is germanium.

13. The method of claim 12, wherein the percentage of Ge in the second layer exceeds 25% and wherein the percentage of Ge in the first layer is less than approximately 20%.

14. The method of claim 13, further wherein the SISD structures have a third layer overlying the second layer, wherein the third layer comprises SiX and wherein the Si:X ratio in the third layer is less than the Si:X ration in the second layer.

15. The method of claim 12, further wherein the second layer includes a p-type dopant.

16. The method of claim 15, wherein forming the SISD structures includes growing the source/drain drain structures with an epitaxial process having a first phase to form the first layer and a second phase to form the second layer, wherein the ambient during the second phase includes the p-type impurity wherein the second layer comprises in situ doped p-type epitaxial silicon germanium.

* * * * *

UNITED STATES PATENT AND TRADEMARK OFFICE
CERTIFICATE OF CORRECTION

| | | |
|---|---|---|
| PATENT NO. | : 7,238,580 B2 | Page 1 of 1 |
| APPLICATION NO. | : 11/043577 | |
| DATED | : July 3, 2007 | |
| INVENTOR(S) | : Marius K. Orlowski | |

It is certified that error appears in the above-identified patent and that said Letters Patent is hereby corrected as shown below:

In Column 10, Line(s) 27-28, Claim No. 10:
    Change "structure wherein the semiconductor SISD structure includes a wherein" to --structure wherein--

In Column 10, Line 46, Claim No. 14:
    Change "less than the Si:X ration in the" to --less than the Si:X ratio in the--

Signed and Sealed this

Eleventh Day of November, 2008

JON W. DUDAS
*Director of the United States Patent and Trademark Office*